United States Patent
Cannon et al.

(10) Patent No.: US 8,618,569 B2
(45) Date of Patent: Dec. 31, 2013

(54) PACKAGED LIGHT EMITTING DIODES INCLUDING PHOSPHOR COATING AND PHOSPHOR COATING SYSTEMS

(75) Inventors: Nathaniel O. Cannon, Durham, NC (US); Mitchell Jackson, Raleigh, NC (US)

(73) Assignee: Cree, Inc., Durham, NC (US)

( * ) Notice: Subject to any disclaimer, the term of this patent is extended or adjusted under 35 U.S.C. 154(b) by 8 days.

(21) Appl. No.: 13/272,712

(22) Filed: Oct. 13, 2011

(65) Prior Publication Data
US 2012/0032220 A1    Feb. 9, 2012

Related U.S. Application Data

(62) Division of application No. 12/014,404, filed on Jan. 15, 2008, now Pat. No. 8,058,088.

(51) Int. Cl.
H01L 33/00    (2010.01)

(52) U.S. Cl.
USPC ........... 257/98; 257/99; 257/100; 257/E33.61

(58) Field of Classification Search
USPC ............................... 257/98, 99, 100, E33.061
See application file for complete search history.

(56) References Cited

U.S. PATENT DOCUMENTS

| | | |
|---|---|---|
| 2,736,671 A | 2/1956 | Ransburg et al. |
| 4,415,123 A | 11/1983 | Ikeuchi |
| 4,918,497 A | 4/1990 | Edmond |
| 4,966,862 A | 10/1990 | Edmond |
| 5,027,168 A | 6/1991 | Edmond |
| 5,210,051 A | 5/1993 | Carter, Jr. |
| 5,338,944 A | 8/1994 | Edmond et al. |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,912,477 A | 6/1999 | Negley |

(Continued)

FOREIGN PATENT DOCUMENTS

| | | |
|---|---|---|
| EP | 1-198-016 A2 | 4/2002 |
| EP | 1198616 A2 | 4/2002 |

(Continued)

OTHER PUBLICATIONS

International Preliminary Report on Patentability Corresponding to International Application No. PCT/US2011/025794; Date of Mailing: Sep. 13, 2012; 9 Pages.

(Continued)

*Primary Examiner* — Minh-Loan T Tran
(74) *Attorney, Agent, or Firm* — Myers Bigel Sibley & Sajovec, P.A.

(57) ABSTRACT

Light emitting structures are disclosed that can include a semiconductor light emitting diode (LED) that includes a p-n junction active layer. A first layer can include a binder material having a thickness that is less than about 1000 μm, wherein the first layer is directly on the LED. A second layer can include phosphor particles, where the second layer can have a thickness that is less than about 1000 μm and can be directly on the first layer so that the first layer is between the LED and the second layer.

16 Claims, 6 Drawing Sheets

(56) References Cited

U.S. PATENT DOCUMENTS

| | | |
|---|---|---|
| 5,959,316 A | 9/1999 | Lowery |
| 5,998,925 A | 12/1999 | Shimizu et al. |
| 6,120,600 A | 9/2000 | Edmond et al. |
| 6,187,606 B1 | 2/2001 | Edmond et al. |
| 6,201,262 B1 | 3/2001 | Edmond et al. |
| 6,576,488 B2 | 6/2003 | Collins, III et al. |
| 6,924,596 B2 | 8/2005 | Sato et al. |
| 6,960,878 B2 | 11/2005 | Sakano et al. |
| 7,304,325 B2 | 12/2007 | Uemura et al. |
| 7,326,583 B2 | 2/2008 | Andrews et al. |
| 7,390,684 B2 | 6/2008 | Izuno et al. |
| 7,442,564 B2 | 10/2008 | Andrews |
| 7,521,728 B2 | 4/2009 | Andrews |
| 7,646,035 B2 | 1/2010 | Loh et al. |
| 2002/0123164 A1 | 9/2002 | Slater et al. |
| 2003/0006418 A1 | 1/2003 | Emerson et al. |
| 2003/0089918 A1 | 5/2003 | Hiller et al. |
| 2004/0056260 A1 | 3/2004 | Slater, Jr. et al. |
| 2004/0256974 A1 | 12/2004 | Mueller-Mach et al. |
| 2005/0218421 A1 | 10/2005 | Andrews et al. |
| 2005/0224821 A1 | 10/2005 | Sakano et al. |
| 2005/0224830 A1* | 10/2005 | Blonder et al. ............... 257/100 |
| 2006/0054076 A1 | 3/2006 | Dwilinski et al. |
| 2006/0124953 A1 | 6/2006 | Negley et al. |
| 2006/0186431 A1 | 8/2006 | Miki et al. |
| 2006/0226758 A1 | 10/2006 | Sofue et al. |
| 2007/0045641 A1 | 3/2007 | Yin Chua et al. |
| 2007/0045761 A1 | 3/2007 | Basin et al. |
| 2007/0080358 A1 | 4/2007 | Tsai |
| 2007/0080635 A1 | 4/2007 | Wang |
| 2007/0120135 A1 | 5/2007 | Soules et al. |
| 2007/0128745 A1 | 6/2007 | Brukilacchio et al. |
| 2007/0148332 A1 | 6/2007 | Lee et al. |
| 2007/0161135 A1 | 7/2007 | Keller et al. |
| 2008/0089053 A1 | 4/2008 | Negley |
| 2008/0179611 A1 | 7/2008 | Chitnis et al. |
| 2008/0217635 A1 | 9/2008 | Emerson et al. |
| 2008/0258602 A1 | 10/2008 | Masuda et al. |
| 2008/0315235 A1 | 12/2008 | Murazaki |
| 2009/0179213 A1 | 7/2009 | Cannon et al. |
| 2009/0184616 A1 | 7/2009 | Van de Ven |
| 2009/0218581 A1 | 9/2009 | Schmidt et al. |
| 2009/0283721 A1 | 11/2009 | Liu et al. |
| 2010/0155763 A1 | 6/2010 | Donofrio et al. |
| 2010/0181582 A1 | 7/2010 | Li et al. |
| 2010/0314656 A1 | 12/2010 | Jeong et al. |
| 2011/0180780 A1 | 7/2011 | Yoo et al. |
| 2011/0248305 A1 | 10/2011 | Ling |
| 2012/0129282 A1 | 5/2012 | Hsia et al. |

FOREIGN PATENT DOCUMENTS

| | | |
|---|---|---|
| JP | 2003-282952 | 10/2003 |
| JP | 2008-541412 (A) | 11/2008 |
| JP | 2010-080588 | 4/2010 |
| WO | WO 2007023439 A2 | 3/2007 |

OTHER PUBLICATIONS

International Search Report and Written Opinion of the International Searching Authority, or the Declaration corresponding to International Application No. PCT/US 11/25794; Date of Mailing: May 9, 2011; 11 Pages.

International Search Report and Written Opinion of the International Searching Authority for PCT/US2011/027362; Date of Mailing: May 5, 2011; 16 pages.

* cited by examiner

PACKAGED LIGHT EMITTING DIODES INCLUDING PHOSPHOR COATING AND PHOSPHOR COATING SYSTEMS

CLAIM OF PRIORITY

The present application is a divisional of U.S. patent application Ser. No. 12/014,404, filed Jan. 15, 2008, the disclosure of which is hereby incorporated by reference herein as if set forth in its entirety.

BACKGROUND

This invention relates to coating of semiconductor devices. In particular, this invention relates to methods for spray-coating semiconductor light emission structures with layers of phosphor and/or other particles.

Light emitting diodes (LEDs) are semiconductor devices that convert electric energy to light. Inorganic LEDs typically include an active layer of semiconductor material and a P-N junction formed at an interface between two oppositely doped layers. When a bias is applied across the P-N junction, holes and/or electrons are injected by the P-N junction into the active layer. Recombination of holes and electrons in the active layer generates light that can be emitted from the LED. The structure of the device, and the material from which it is constructed, determine the intensity and wavelength of light emitted by the device. Recent advances in LED technology have resulted in highly efficient solid-state light sources that surpass the efficiency of incandescent and halogen light sources, providing light with equal or greater brightness in relation to input power.

Conventional LEDs generate narrow bandwidth, essentially monochromatic light. However, it is highly desirable to generate wide bandwidth, polychromatic light, such as white light, using a solid state light source. One way to produce white light from conventional LEDs is to combine different wavelengths of light from different LEDs. For example, white light can be produced by combining the light from red, green and blue emitting LEDs, or combining the light from blue and amber LEDs. This approach, however, requires the use of multiple LEDs to produce a single color of light, which can potentially increase the overall cost, size, complexity and/or heat generated by such a device. In addition, the different colors of light may also be generated from different types of LEDs fabricated from different material systems. Combining different LED types to form a white lamp can require costly fabrication techniques and can require complex control circuitry, since each device may have different electrical requirements and/or may behave differently under varied operating conditions (e.g. with temperature, current or time).

Light from a blue emitting LED has been converted to white light by surrounding the LED with a yellow phosphor, polymer or dye, such as cerium-doped yttrium aluminum garnet (Ce:YAG). The phosphor material absorbs and "downconverts" some of the blue light generated by the LED. That is, the phosphor material generates light, such as yellow light, in response to absorbing the blue light. Thus, some of the blue light generated by the LED appears to be converted to yellow light. Some of the blue light from the LED passes through the phosphor without being changed, however. The overall LED/phosphor structure emits both blue and yellow light, which combine to provide light that is perceived as white light.

LEDs have been combined with phosphor layers by dispensing a volume of phosphor-containing encapsulant material (e.g., epoxy resin or silicone) over the LED to cover the LED. In these methods, however, it can be difficult to control the geometry and/or thickness of the phosphor layer. As a result, light emitted from the LED at different angles can pass through different amounts of conversion material, which can result in an LED with non-uniform color temperature as a function of viewing angle. Because the geometry and thickness is hard to control, it can also be difficult to consistently reproduce LEDs with the same or similar emission characteristics.

Another conventional method for coating an LED is by stencil printing. In a stencil printing approach, multiple light emitting semiconductor devices are arranged on a substrate with a desired distance between adjacent LEDs. The stencil is provided having openings that align with the LEDs, with the holes being slightly larger than the LEDs and the stencil being thicker than the LEDs. A stencil is positioned on the substrate with each of the LEDs located within a respective opening in the stencil. A composition is then deposited in the stencil openings, covering the LEDs, with a typical composition being a phosphor in a silicone polymer that can be cured by heat or light. After the holes are filled, the stencil is removed from the substrate and the stenciling composition is cured to a solid state.

Like the volumetric dispense method described above, the stenciling method may also present difficulties in controlling the geometry and/or layer thickness of the phosphor containing polymer. The stenciling composition may not fully fill the stencil opening, resulting in non-uniform layers. The phosphor-containing composition can also stick to the stencil opening, which may reduce the amount of composition remaining on the LED. These problems can result in LEDs having non-uniform color temperature and LEDs that are difficult to consistently reproduce with the same or similar emission characteristics.

Another conventional method for coating LEDs with a phosphor utilizes electrophoretic deposition (EPD). The conversion material particles are suspended in an electrolyte based solution. A plurality of LEDs are immersed in the electrolyte solution. One electrode from a power source is coupled to the LEDs, and the other electrode is arranged in the electrolyte solution. The bias from the power source is applied across the electrodes, which causes current to pass through the solution to the LEDs. This creates an electric field that causes the conversion material to be drawn to the LEDs, covering the LEDs with the conversion material.

After the LEDs are covered by the conversion material, they are removed from the electrolyte solution so that the LEDs and their conversion material can be covered by a protective resin. This adds an additional step to the process and the conversion material (phosphor particles) can be disturbed prior to the application of the epoxy. During the deposition process, the electric field in the electrolyte solution can also vary such that different concentrations of conversion material can be deposited across the LEDs. The conversion particles can also settle in the solution, which can also result in different conversion material concentrations across the LEDs. The electrolyte solution can be stirred to prevent settling, but this presents the danger of disturbing the particles already on the LEDs.

Still another coating method for LEDs utilizes droplet deposition using systems similar to those in an ink-jet printing apparatus. Droplets of a liquid phosphor-containing material are sprayed from a print head. The phosphor-containing droplets are ejected from a nozzle on the print head in response to pressure generated in the print head by a thermal bubble and/or by piezoelectric crystal vibrations. However, in order to control the flow of the phosphor-containing composition from the ink-jet print head, it may be necessary for the print head nozzle to be relatively small. In fact, it may be desirable to engineer the size and/or shape of the phosphor particles to prevent them from catching in the nozzle and clogging the print head.

SUMMARY

Some embodiments of the invention provide light emitting structures including a semiconductor light emitting diode (LED) including a p-n junction active layer, a first layer including binder material and having a thickness less than about 1000 µm directly on the LED, and a second layer including phosphor particles. The second layer has a thickness less than about 1000 µm and is directly on the first layer so that the first layer is between the LED and the second layer.

The first layer may include a binder layer sprayed directly on the chip and the second layer may include a phosphor layer sprayed directly on the binder layer.

The first layer may be thicker than the second layer. In some embodiments, the first layer has a thickness that is about 100 times a thickness of the second layer. In further embodiments, the first layer and the second layer have about a same thickness.

The light emitting structure may include a third layer of binder material directly on the second layer. The light emitting structure may further include a fourth layer including light diffuser particles on the third layer.

The light emitting structure may further include a third layer including binder material directly on the second layer and having a thickness less than about 1000 µm, and a fourth layer including phosphor particles having a thickness less than about 1000 µm directly on the third layer of binder material.

The semiconductor light emitting diode may include an LED wafer and/or an LED chip.

The phosphor particles may include first phosphor particles configured to emit light at a first dominant wavelength, and the structure may further include a third layer on the second layer and having a thickness less than about 1000 µm. The third layer may include second phosphor particles configured to emit light at a second dominant wavelength. The first dominant wavelength is the same as or different from the second dominant wavelength.

A light emitting structure according to further embodiments of the invention includes a semiconductor light emitting diode (LED) including a p-n junction active layer, a first layer including binder material having a thickness less than about 1000 µm directly on the LED, and a second layer including phosphor particles and having a thickness less than about 1000 µm. The second layer is directly on the first layer so that the first layer is between the LED and the second layer, and a third layer including diffuser particles is on the second layer.

The phosphor particles may include first phosphor particles configured to emit light at a first dominant wavelength, and the structure may further include a fourth layer on the second layer and having a thickness less than about 1000 µm. The fourth layer includes second phosphor particles configured to emit light at a second dominant wavelength.

Some embodiments of the invention provide a deposition system including a liquid supply line, a reservoir coupled to the liquid supply line and configured to supply a liquid solvent containing particles of optical material to the liquid supply line, and a spray nozzle coupled to the liquid supply line and configured to receive the liquid solvent from the liquid supply line. A gas line is coupled to the spray head and is configured to provide a pressurized gas to the spray nozzle, and a controller is configured to control a flow of the liquid solvent into the spray nozzle.

The deposition system may further include a mass flow controller configured to control a second flow of the liquid solvent from the reservoir into the supply line, and the controller may be further configured to control the mass flow controller.

The deposition system may further include an optical sensor configured to detect light output by an LED structure, and the controller may be configured to control the flow of the liquid solvent into the spray nozzle in response to the detected light output.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1:
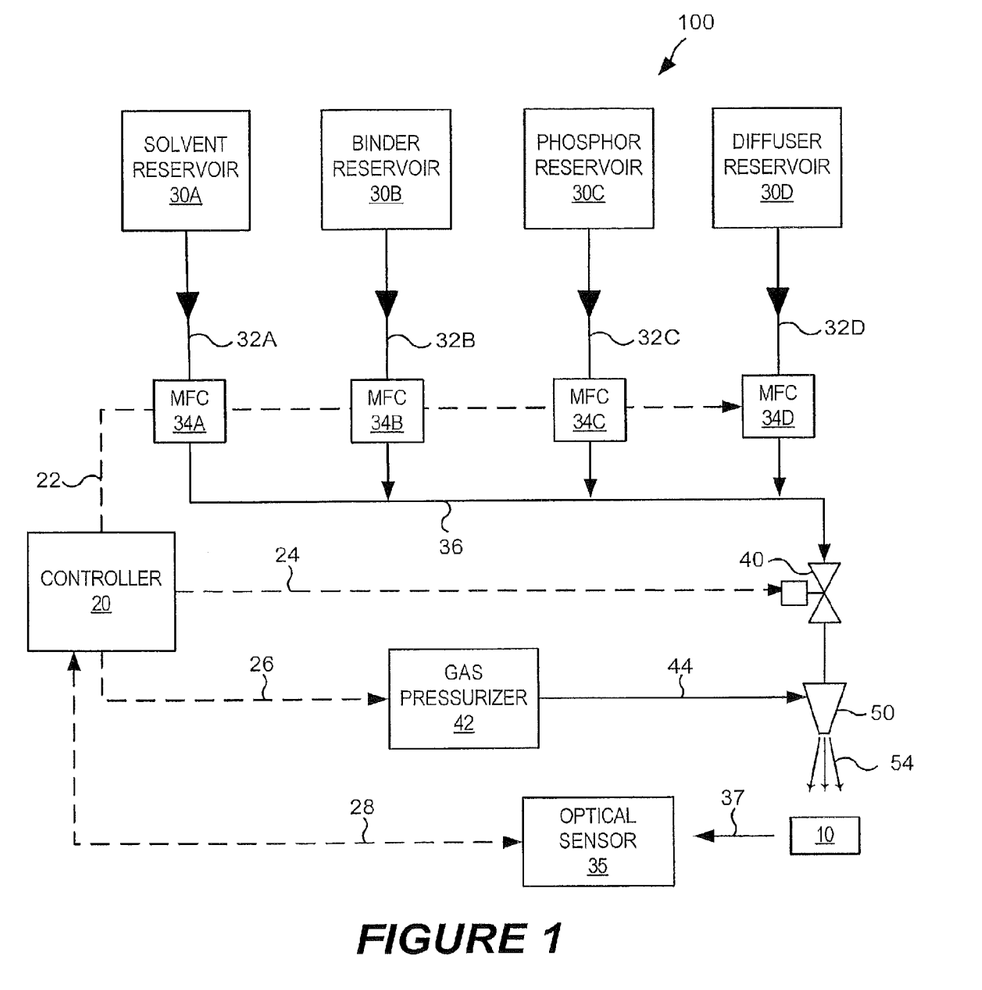
FIG. 1 is a schematic diagram illustrating a pressurized deposition system for coating a light emitting diode (LED) structure with optical materials, according to some embodiments of the invention.

FIG. 1 is a schematic diagram illustrating a pressurized deposition system 100 for coating a light emitting diode (LED) structure 10 with optical materials, such as luminescent particles and/or diffuser particles. According to some embodiments, the optical materials are sprayed onto the LED structure 10 by the system 100. As shown in FIG. 1, a supply line 36 supplies a carrier liquid containing the optical materials to a spray nozzle 50. The carrier liquid is sprayed onto an LED structure 10 via the spray nozzle 50. In particular, pressurized gas supplied to the spray nozzle 50 through a high pressure gas supply line 44 atomizes the carrier liquid and directs the atomized liquid including the optical materials towards the LED structure 10 where the optical materials are deposited, as described in more detail below. (As noted above, the term "atomize" is used herein in a general sense to refer to reducing a liquid to minute particles or to a fine spray.) The LED structure 10 can include an LED wafer, a mounted LED die and/or an unmounted (i.e. bare) LED die. Accordingly, systems and methods according to embodiments of the invention can be used at various stages of a manufacturing process.

The liquid in the supply line 36 can include, for example, a binder material, such as liquid silicone and/or liquid epoxy, and/or a volatile solvent material, such as alcohol, water, acetone, methanol, ethanol, ketone, isopropynol, hydrocarbon solvents, hexane, ethylene glycol, methyl ethyl ketone, and combinations thereof. In general, a volatile solvent dries or evaporates off shortly after being deposited. A volatile or nonvolatile solvent material can include particles therein that are to be deposited onto the LED structure, such as particles of a luminescent material (e.g. a phosphor) and/or particles of a light-scattering material, such as titanium dioxide. The liquid in the supply line 36 is provided from one of a plurality of fluid reservoirs 30A to 30D, which are attached to the supply line 36 through respective input lines 32A to 32D. The flow of liquid through the input lines 32A to 32D can be carefully controlled by electronically-controlled mass flow controllers 34A to 34D, respectively.

As shown in FIG. 1, the reservoirs 30A to 30D can include a solvent reservoir 30A that contains a volatile liquid solvent, such as alcohol, water, etc., and a binder reservoir 30B that contains a liquid binder material, such as liquid silicone and/or liquid epoxy. In some embodiments, the solvent reservoir 30A and the binder reservoir 30B can include "pure" liquids, that is, liquids that do not contain any phosphor, diffuser, or other particles therein. The reservoirs 30A to 30D can also include a phosphor reservoir 30C that contains a liquid solvent in which a concentration of phosphor particles is suspended. In some embodiments, the phosphor reservoir 30C can include phosphor particles at a concentration that is greater than a concentration at which the phosphor particles will be applied onto the LED structure 10.

The reservoirs 30A to 30D can also include a diffuser reservoir 30D that contains a liquid solvent in which a concentration of diffuser particles is suspended. In some embodiments, the diffuser reservoir 30D can include diffuser particles at a concentration that is greater than a concentration at which the diffuser particles will be applied onto the LED structure 10.

One or more of the reservoirs 30A to 30D can be pressurized, so that flow from the reservoirs 30A to 30D can be obtained by positive pressure into the supply line 36. In particular, the solvent reservoir 30A and the binder reservoir 30B can be pressurized. In some embodiments, the phosphor reservoir 30C and/or the diffuser reservoir 30D may not be pressurized, so that flow from the phosphor reservoir 30C and/or the diffuser reservoir 30D may be induced into the supply line 36 by negative pressure caused by flow through the supply line 36. The pressure in the liquid supply line 36 need not be high, since the force for spraying the liquid onto the LED structure 10 is provided by a high-pressure gas line 44.

The flow of liquid through the supply line 36 can be controlled by an electronically controllable valve 40. When the valve 40 is open, liquid in the supply line 36 is supplied to the spray nozzle 50.

Figure 2:
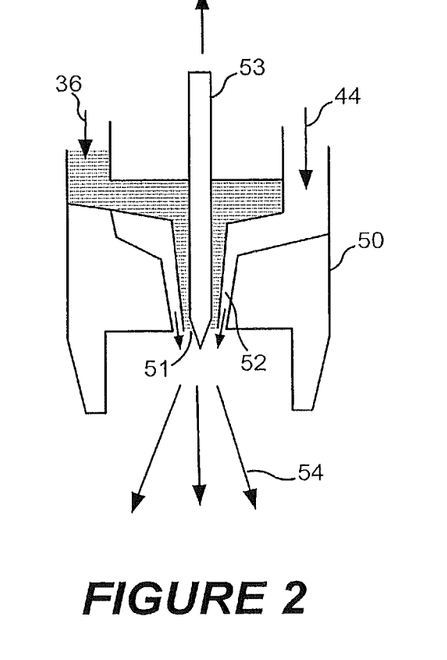
FIG. 2 illustrates a spray nozzle according to embodiments of the invention.

FIG. 2 illustrates a spray nozzle 50 according to embodiments of the invention in greater detail. Referring to FIGS. 1 and 2, pressurized gas (e.g., pressurized air) generated by a gas pressurizer 42 is supplied to the spray nozzle 50 through the pressurized gas supply line 44. The pressurized gas is directed to through a gas outlet port 52 in the spray nozzle 50 that is adjacent a liquid outlet port 51. The flow of liquid through the liquid outlet port 51 can be regulated, for example, by controlling the position of a retractable pin 53. When the pin 53 is retracted, the liquid outlet port 51 is opened. The flow of pressurized gas out of the gas outlet port 52 creates a negative pressure gradient relative to the liquid outlet port 51, which causes liquid dispensed from the liquid outlet port 51 to be atomized. The atomized liquid 54 is then carried by the gas flow from the gas outlet port 52 to the LED structure 10, where the atomized liquid 54 flow deposits on the LED structure.

As further illustrated in FIG. 1, operations of the mass flow controllers 34A to 34D, the electronically controllable flow valve 40, and the gas pressurizer 42 can be controlled by a controller 20 via electronic control lines 22, 24, 26. The controller 20 can be a conventional programmable controller and/or can include an application specific integrated circuit (ASIC) configured to control operation of the respective elements of the system 100, or a general microprocessor or controller (e.g. computer).

Referring still to FIG. 1, by controlling the operations of the mass flow controllers (MFCs) 34A to 34D and the valve 40, the controller 20 can control the composition of liquid that is supplied to the spray nozzle 50 through the supply line 36. In particular, the controller 20 can cause the MFCs 30A, 30C and 30D to turn off, while the MFC 30B and the valve 40 are turned on, to thereby supply the binder liquid to the spray nozzle 50. Likewise, the controller 20 can cause the MFCs 30B, 30C and 30D to turn off, while the MFC 30A and the valve 40 are turned on, to thereby supply only the solvent liquid to the spray nozzle 50. With the solvent material from the solvent reservoir 30A flowing, the controller 20 can cause the MFCs 34C and/or 34D to release liquids bearing phosphor particles (in the case of the phosphor reservoir 30C) and/or diffuser particles (in the case of the diffuser reservoir 30D) into the flow in the supply line 36. Accordingly, the controller 20 can precisely control the composition of material sprayed onto the LED structure 10 by the spray nozzle 50.

It will be appreciated that while FIG. 1 illustrates a single phosphor reservoir 30C and a single diffuser reservoir 30D, more reservoirs can be provided and attached to the supply line through respective MFCs and/or supply valves that can be electronically controlled by the controller 20. For example, separate phosphor reservoirs can be provided for red phosphors, green phosphors, yellow phosphors, blue phosphors, etc., depending on the product requirements. Furthermore, more than one type of diffuser particle can be selectively provided using different diffuser reservoirs. For example, it may be desirable to apply diffuser particles having a first composition and/or diameter on one part of an LED structure 10 and diffuser particles having a different composition and/or diameter on another part of the LED structure 10.

It will be further appreciated that a system 100 as illustrated in FIG. 1 may be split into several parts, so that, for example, separate supply lines 36 are provided and/or separate spray nozzles 50 are provided. For example, a system could have one supply line 36 and nozzle 50 dedicated to spray-applying a binder material, and a separate supply line 36 and nozzle 50 dedicated to spray-applying phosphor-bearing liquids and/or diffuser-bearing liquids. Accordingly, many different combinations of reservoirs, supply lines and spray nozzles are contemplated according to various embodiments.

FIG. 1 further illustrates an optical sensor 35 that is configured to sense light 37 emitted by the LED structure 10. For example, the optical sensor 35 can detect a color point and/or intensity of light emitted by the LED structure 10. The detected light information can be provided to the controller 30 via a communication line 28, and can be used as a feedback signal in the control of the operations of the deposition system 100, as described in more detail below.

Referring now to FIGS. 3A to 3D, application of optical materials to an LED structure is illustrated. In the embodiments of FIGS. 3A to 3D, the optical materials are applied to an LED chip or die 70 mounted on a substrate 60. However, as explained above, optical materials may be applied in a similar manner to bare (i.e. unmounted) LED die and/or to LED wafers. An LED wafer includes a wafer substrate on which thin epitaxial layers forming an LED active layer have been formed and/or mounted. Accordingly, an LED wafer can include a growth substrate on which the epitaxial layers have been grown and/or a carrier substrate to which the epitaxial layers have been transferred.

Figure 3A:
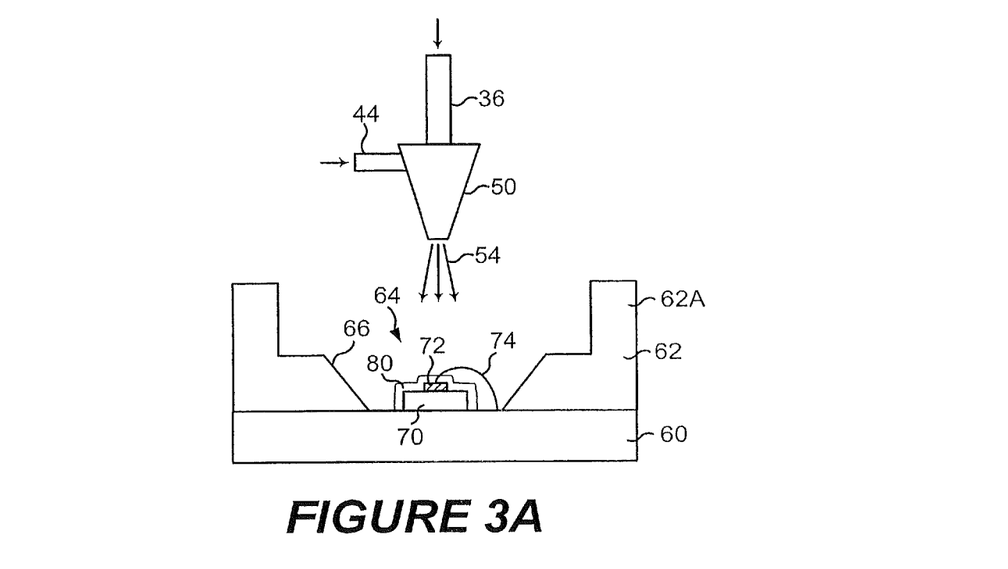
FIGS. 3A, 3B, 3C and 3D illustrate the application of optical materials to a mounted LED chip according to some embodiments.

As shown in FIG. 3A, an LED chip 70 is mounted on a substrate 60. The LED chip 70 can be mounted on the substrate 60 through an intermediary structure, such as a bonding pad and/or submount (not shown). In some embodiments, The LED chip 70 can be mounted in an optical cavity 64 defined by a reflector cup 62 that is placed on the substrate 60. The reflector cup 62 includes an angled reflective surface 66 facing the LED chip 70 and configured to reflect light emitted by the LED chip 70 away from the optical cavity 64. The reflector cup 62 further includes upwardly extending sidewalls 62A that define a channel for receiving and holding a lens 94 (FIG. 3D).

It will be appreciated that the reflector cup 62 is optional. For example, the LED chip 70 could be mounted on a substrate 60, printed circuit board or other support member without any reflector around the LED chip 70. Moreover, the reflector cup 62 and the substrate 60 could be merged together as a unitary structure. The substrate 60 could also include a leadframe, and a package body may be formed on the leadframe surrounding the LED chip 70 and defining the optical cavity 64. Accordingly, the LED chip 70 could be mounted in many different styles of packaging, and the present invention is not limited to the particular packaging configuration shown in the Figures.

Still referring to FIG. 3A, the LED chip 70 can include a wirebond pad 72, and a wirebond connection 74 can be formed from the wirebond pad 72 to a corresponding contact pad (not shown) on the substrate 60 or elsewhere. However, it will be appreciated that the LED chip 70 could be a horizontal LED chip having both anode and cathode contacts on the same side of the chip, and could be mounted in flip-chip fashion on the substrate 60, so that no bond wire connections may be made to the LED chip in some embodiments.

Referring to FIGS. 1, 2 and 3A, the controller 20 of the pressurized deposition system 100 can cause a liquid binder material 80 to be supplied to the spray nozzle 50 through the supply line 36. For example, the controller 20 can open the MFC 34B and the valve 40 and close the MFCs 34A, 34C and 34D. Any remaining phosphor-bearing solvents in the supply line 36 can be purged prior to deposition of the binder material.

The liquid binder material 80 is sprayed onto the LED chip 70, forming a thin layer of binder material 80 thereon. The binder material may be formed to have a thickness of less than about 1000 μm, and in some embodiments, may have a thickness less than 1 μm. As noted above, the liquid binder material can include a material such as silicone and/or epoxy.

Figure 3B:
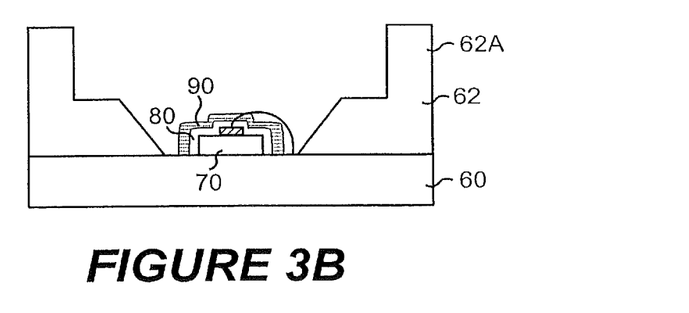

Referring to FIGS. 1, 2, and 3B, after application of the binder material 80, the supply line 36 can again be purged, and a liquid solvent can be supplied to the supply line 36 by opening the MFC 34A. A desired concentration of optical materials, such as phosphor particles and/or diffuser particles can be provided into the supply line 36 by controlling the MFCs 34C, 34D. The liquid solvent may in some embodiments include a volatile liquid solvent, such as alcohol and/or any of the volatile solvents listed above. The liquid solvent including the optical materials is sprayed onto the LED chip 70, forming a thin coating 90 (e.g., less than 1000 μm, and in some embodiments, less than 1 μm) on the binder material 80.

The volatile solvent liquid may then be evaporated off, leaving the optical materials (e.g., phosphor particles and/or diffuser particles) stuck to the binder material 80. After evaporation of the solvent, the remaining layer of phosphor particles can have a thickness of about 1 µm to about 1000 µm. Accordingly, in some embodiments, a layer of phosphor materials can be substantially thinner than the layer of binder material. However, in some cases, a non-volatile solvent, such as silicone and/or epoxy resin, may be used as a carrier liquid for the phosphor/diffuser particles, in which case the non-volatile solvent may be cured to form a layer 90 of optical material over the LED chip 70.

Figure 3C:
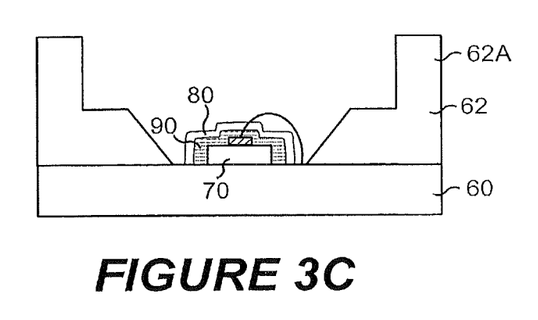
Figure 3D:
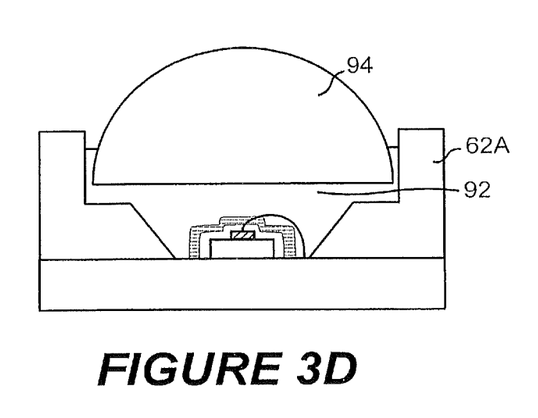

As shown in FIG. 3C, the layer 90 of optical material may be formed on the LED chip 70 first, and then the layer 80 of binder material can be formed over the layer 90 of optical material. The layer 90 of optical material may be formed by spraying the liquid solvent including the optical materials therein onto the LED chip 70 and then evaporating/curing the solvent before applying the layer 80 of binder material over the layer 90.

Referring to FIG. 3D, after spray-coating the LED chip 70 with the layers 80, 90 of binder and phosphor material, an encapsulant material 92, such as silicone and/or epoxy, can be dispensed to at least partially fill the optical cavity 64, and a lens 94, such as a glass or silicone lens, can be positioned over the LED chip 70. Curing the encapsulant material 92 secures the lens 94 to the structure, while the vertical wall portions 62A of the reflector cup 62 allow the lens to travel as the encapsulant material 92 expands and contracts with heating/cooling cycles.

In some embodiments, spray-coating of binder material layers and optical material layers can be alternated. For example, referring to FIG. 4, a layer 80A of binder material may be coated onto an LED chip 70 on a submount 60. A layer 90A of optical material, such as phosphor particles and/or diffuser particles, can be formed on the layer 80A in the manner described above. A second layer 80B of binder material can then be applied onto the layer 90A of an optical material, and a second layer 90B of optical material can be applied onto the second layer 80B of binder material. In some embodiments, the second layer 80B of binder material can be omitted from between the first layer 90A and the second layer 90B of phosphor material.

Figure 4:
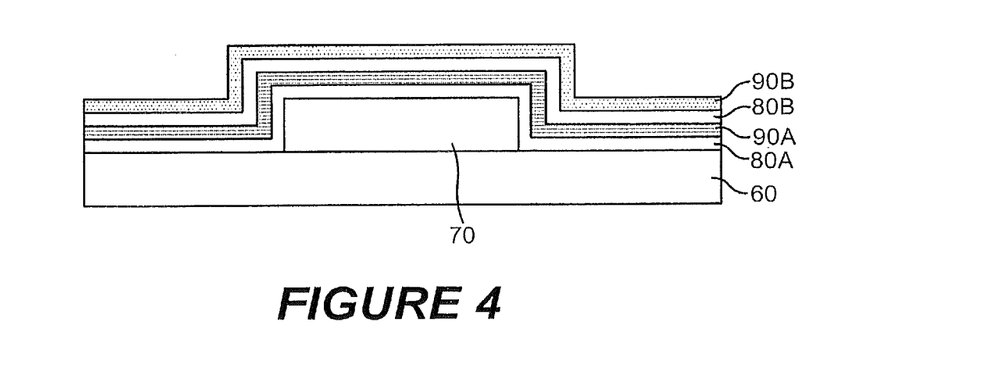
FIG. 4 illustrate the application of optical materials to an LED chip according to some embodiments.

The first layer 90A and second layer 90B of optical materials can include the same or different optical materials. For example, the first layer 90A of optical material can include phosphor particles, while the second layer 90A of optical material can include diffuser particles, or vice-versa. In some embodiments, the first layer 90A of optical material can include phosphor particles configured to convert incident light to a first wavelength (e.g. yellow), while the second layer 90A of optical material can include phosphor particles configured to convert incident light to a second wavelength, different from the first wavelength (e.g. red). Accordingly, light output by the packaged LED chip 70 can be a mixture of primary light emitted by the LED chip 70 and secondary light emitted by the first layer 90A of phosphor and the second layer 90B of phosphor. Such light can have improved color rendering properties compared to light generated using only one kind of phosphor.

In some embodiments, the first layer of optical material 90A and the second layer of optical material 90B can include the same type of phosphor. For example, referring to FIGS. 1, 4 and 5, a first binder layer 80A can be applied to an LED structure, such as an LED chip 70 (Block 202) using a spray deposition system 100 according to embodiments of the invention. A first phosphor layer 90A can then be applied to the binder layer by spray-coating a phosphor-bearing solvent (Block 204). The solvent can then be evaporated and/or cured, depending on whether the solvent is volatile or non-volatile, and the binder material can be cured to adhere the phosphor particles to the LED chip 70 (Block 206). At this point, the LED structure could be stored, e.g. at room temperature, to be later retrieved for further tuning.

Figure 5:
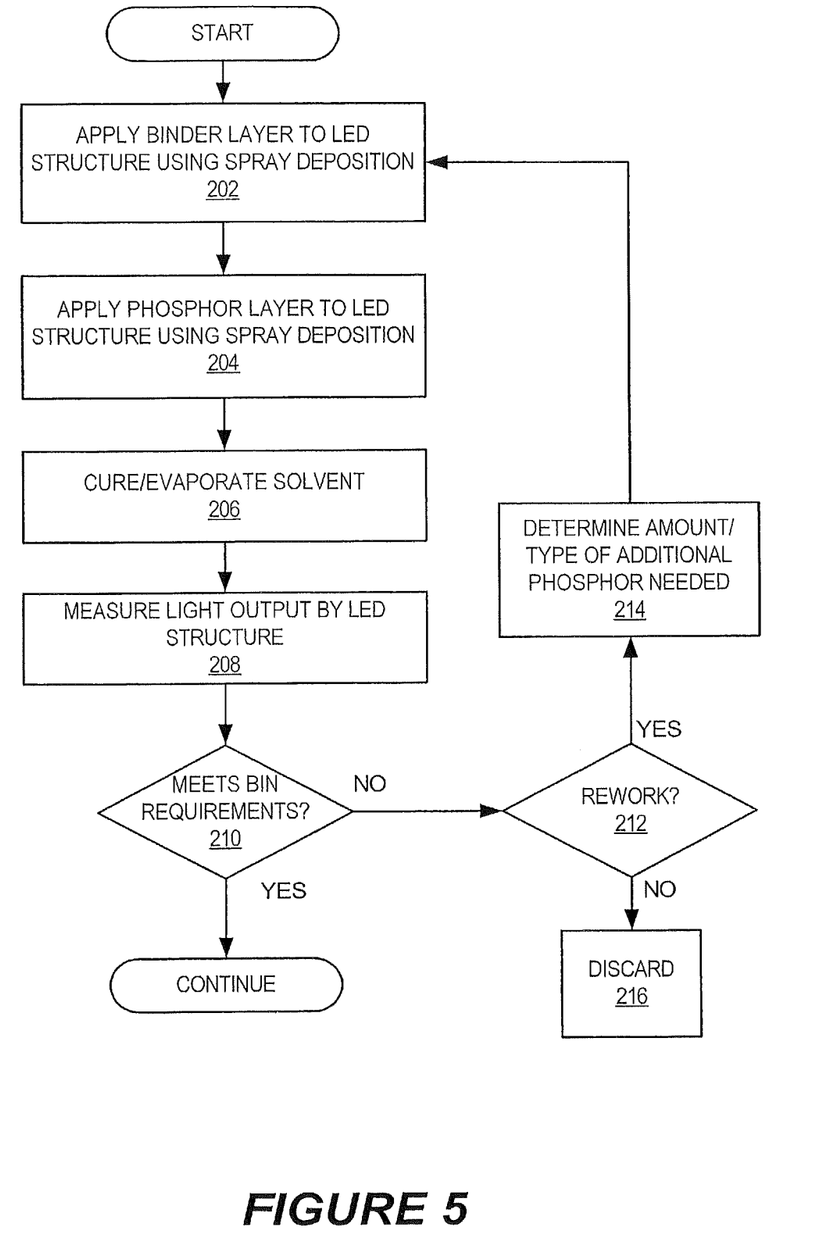
FIG. 5 is a flowchart illustrating operations according to some embodiments of the invention.

The LED structure can then be energized, for example, by applying a voltage across anode and cathode terminals of the device, and the optical characteristics (e.g., power output, color point, CCT) of the device including the first phosphor layer 80A can be measured. In particular, the output power (brightness), color point and/or correlated color temperature (CCT) of the LED structure can be measured (Block 208). For example, the light output by the LED structure can be measured by an optical sensor 35, and the results can be provided to the controller 20. Testing the LED structure may be easiest when the LED structure includes a mounted LED chip. When the LED structure includes an LED wafer, it may be possible to test representative areas/devices on the wafer instead of testing every device on the wafer, and tune the entire wafer based on the light output from the test locations.

A test is then performed to determine if the optical characteristics of the wafer are acceptable, i.e. to see if the wafer meets established binning requirements (Block 210). If the optical characteristics of the structure are unacceptable, a decision is made at Block 212 whether to discard the device (Block 216) or rework the device. However, if the optical characteristics are satisfactory, the manufacturing process proceeds to the next manufacturing step.

If it is determined that the device can be reworked, the light output from the LED structure can be tuned by determining the amount and type of additional phosphor needed to correct the color point/CCT of the structure (Block 214). A second binder layer 80B can be applied (Block 202) and/or the first binder layer can be reheated so that it again becomes tacky, and a second phosphor layer 90B of the same or different type from the phosphor used in the first phosphor layer 90A can be applied using the spray deposition system 100 under the direction of the controller 20.

In general, the operations of blocks 202-214 can be repeated as desired to achieve the desired optical characteristics. However, if too much phosphor is applied, the light emission characteristics may deteriorate due to reabsorption and/or excessive absorption of light from the LED structure, at which point the LED structure may fail the test at Block 210.

The solvent liquid carrying the binder material can be evaporated/cured after each coating layer of optical material is applied. Furthermore the liquid binder material can be fully and/or partially cured after each coating layer of binder material is applied and/or after the solvent liquid applied thereto is evaporated/cured.

Figure 6A:
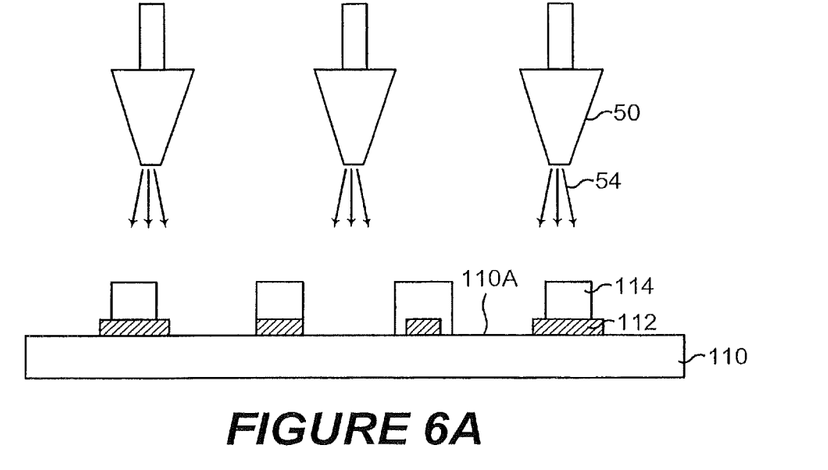
FIGS. 6A, 6B and 6C illustrate the application of optical materials to an LED wafer according to some embodiments.
Figure 6B:
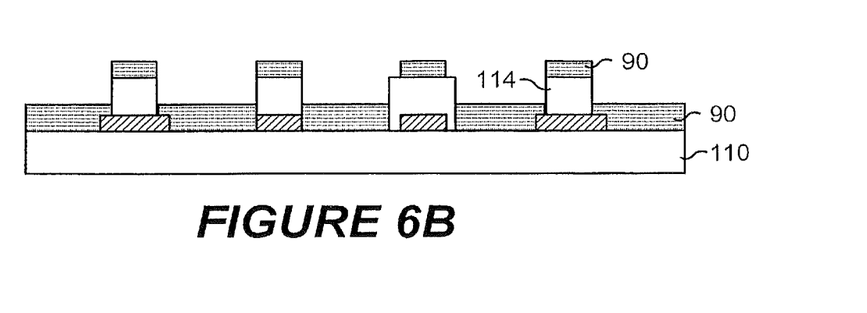
Figure 6C:
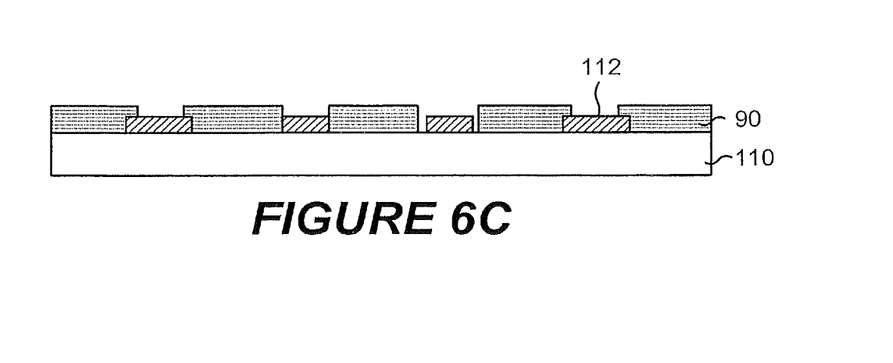

FIGS. 6A to 6C illustrate operations associated with coating an LED wafer according to some embodiments. Referring to FIG. 6A an LED wafer 110 is provided. As discussed above, an LED wafer includes a plurality of thin epitaxial layers that define a light emitting diode structure. The epitaxial layers are supported by a substrate that can include a growth substrate and/or a carrier substrate. The epitaxial region of the LED wafer 110 can be divided into a plurality of discrete device regions, for example, by mesa and/or implant isolation. In some embodiments, dicing streets (i.e. linear regions where the wafer is to be diced using a dicing saw) and/or scribe lines may already be formed in the LED wafer 110. A plurality of electrical contacts 112 are formed on the LED wafer 110. In particular, each discrete device in the LED wafer 110 can include at least one electrical contact 112 on a side of the wafer on which phosphor is to be applied.

A sacrificial pattern 114 is formed on the electrical contacts 112. The sacrificial pattern 114 can include a material such as soluble polymer and/or glass, which can be applied and patterned using conventional photolithographic techniques. The sacrificial pattern 114 can be aligned with the underlying electrical contacts 112. Alternatively, the sacrificial pattern 114 can cover only portions of the electrical contacts 112, with some portions of the electrical contacts 112 being exposed. In some embodiments, the sacrificial pattern 114 can be wider than the electrical contacts 112, so that portions of the surface 110A of the LED wafer 110 adjacent the electrical contacts are also covered by the sacrificial patterns. All three possibilities are illustrated in FIG. 6A.

Referring still to FIGS. 6A and 6B, one or more layers 90 of optical material, such as phosphor particles and/or diffuser particles, are applied to the surface 110A of the LED wafer 110 using a spray nozzle 50 of a pressurized deposition system 100 (FIGS. 1 and 2). One or more layers of binder material (FIGS. 3A to 3D, 4) may also be coated on the LED wafer 110 over and/or under the phosphor layer 90. The layer 90 is coated onto the surface 110A of the LED wafer 110, and on the sacrificial pattern 114. In some embodiments, the layer 90 may also be coated onto upper portions of the electrical contacts 112 opposite the LED wafer 110.

After spray-coating the LED wafer 110, the sacrificial pattern 114 can be removed, for example, by exposure to a liquid solvent specific to the sacrificial pattern material, resulting in an LED wafer 110 as shown in FIG. 6C that includes exposed electrical contacts 112 and one or more layers 90 of optical material on the surface of the LED wafer 110.

In the drawings and specification, there have been disclosed typical embodiments of the invention and, although specific terms are employed, they are used in a generic and descriptive sense only and not for purposes of limitation, the scope of the invention being set forth in the following claims

What is claimed is:

1. A light emitting structure, comprising:
   a semiconductor light emitting diode (LED) comprising a p-n junction active layer;
   a first layer comprising binder material having a thickness less than about 1000 μm directly on the LED;
   a second layer comprising phosphor particles and having a thickness less than about 1000 μm, the second layer directly on the first layer so that the first layer is between the LED and the second layer; and
   a third layer on the second layer, the third layer comprising diffuser particles.

2. The light emitting structure of claim 1, wherein the first layer comprises a binder layer sprayed directly on the LED and the second layer comprises a phosphor layer sprayed directly on the binder layer.

3. The light emitting structure of claim 1, wherein the first layer is thicker than the second layer.

4. The light emitting structure of claim 1, wherein the first layer has a thickness that is about 100 times a thickness of the second layer.

5. The light emitting structure of claim 1, wherein the first layer and the second layer have about a same thickness.

6. The light emitting structure of claim 1, further comprising:
   a fourth layer comprising phosphor particles having a thickness less than about 1000 μm directly on the first layer of binder material.

7. The light emitting structure of claim 1, wherein the semiconductor light emitting diode comprises an LED wafer.

8. The light emitting structure of claim 1, wherein the semiconductor light emitting diode comprises an LED chip.

9. The light emitting structure of claim 1, wherein the phosphor particles comprises first phosphor particles configured to emit light at a first dominant wavelength, the structure further comprising:
   a fourth layer on the second layer and having a thickness less than about 1000 μm, the fourth layer comprising second phosphor particles configured to emit light at a second dominant wavelength.

10. The light emitting structure of claim 9, wherein the first dominant wavelength is the same as the second dominant wavelength.

11. The light emitting structure of claim 9, wherein the first dominant wavelength is different from the second dominant wavelength.

12. The light emitting structure of claim 1, wherein the phosphor particles comprises first phosphor particles configured to emit light at a first dominant wavelength, the structure further comprising:
   a fourth layer on the second layer and having a thickness less than about 1000 μm, the fourth layer comprising second phosphor particles configured to emit light at a second dominant wavelength.

13. The light emitting structure of claim 1, wherein the first layer is directly on an upper surface of the LED that is opposite a surface of a substrate beneath the LED.

14. The light emitting structure of claim 1, wherein the first layer is directly on an upper surface of the LED that is opposite a surface of a substrate beneath the LED.

15. The light emitting structure of claim 1, wherein the binder material comprises silicone and/or epoxy.

16. A light emitting structure, comprising:
   a semiconductor light emitting diode (LED) comprising a p-n junction active layer;
   a first layer comprising binder material and having a thickness less than about 1000 μm, wherein the first layer is directly on the LED;
   a second layer comprising phosphor particles, the second layer having a thickness less than about 1000 μm and being directly on the first layer so that the first layer is between the LED and the second layer;
   a third layer of binder material directly on the second layer; and
   a fourth layer including light diffuser particles on the third layer.

* * * * *